(12) United States Patent
Perry et al.

(10) Patent No.: US 7,518,899 B2
(45) Date of Patent: Apr. 14, 2009

(54) METHOD OF PROVIDING OPTIMAL FIELD PROGRAMMING OF ELECTRONIC FUSES

(75) Inventors: Troy J. Perry, Georgia, VT (US); Michael J. Ouellette, Westford, VT (US)

(73) Assignee: International Business Machines Corporation, Armonk, NY (US)

(*) Notice: Subject to any disclaimer, the term of this patent is extended or adjusted under 35 U.S.C. 154(b) by 248 days.

(21) Appl. No.: 11/555,323

(22) Filed: Nov. 1, 2006

(65) Prior Publication Data

US 2008/0101145 A1 May 1, 2008

(51) Int. Cl.
*G11C 17/00* (2006.01)
(52) U.S. Cl. ........................................... 365/96
(58) Field of Classification Search ................. 365/96, 365/225.7
See application file for complete search history.

(56) References Cited

U.S. PATENT DOCUMENTS

| | | | |
|---|---|---|---|
| 4,268,911 A | 5/1981 | Bell | |
| 6,704,228 B2 * | 3/2004 | Jang et al. | ................. 365/225.7 |
| 7,129,769 B2 | 10/2006 | Dixon et al. | |
| 7,170,299 B1 | 1/2007 | Anand et al. | |
| 7,436,729 B2 * | 10/2008 | Yoshida et al. | ................. 365/96 |
| 2002/0018355 A1 | 2/2002 | Johnson et al. | |
| 2006/0136858 A1 | 6/2006 | Erickson et al. | |

FOREIGN PATENT DOCUMENTS

JP   59 036497 A   2/1982

* cited by examiner

*Primary Examiner*—Tuan T. Nguyen
(74) *Attorney, Agent, or Firm*—Downs Rachlin Martin PLLC

(57) ABSTRACT

A method of providing optimal fuse programming conditions by which an integrated circuit chip customer may program electronic fuses in the field, i.e., outside of the manufacturing test environment. An optimal fuse programming identifier, which is correlated to optimal fuse programming conditions, may be provided to the customer in readable fashion on the customer's IC chip. Accessing the optimal fuse programming identifier on the customer's IC chip, the customer may apply a fuse programming process in the field according to one or more correlated optimal fuse programming conditions.

8 Claims, 4 Drawing Sheets

METHOD OF PROVIDING OPTIMAL FIELD PROGRAMMING OF ELECTRONIC FUSES

RELATED APPLICATION DATA

This application is related to co-pending and currently allowed U.S. patent application Ser. No. 11/276,120, filed Feb. 15, 2006, and titled "Electronic fuse blow mimic and methods for adjusting electronic fuse blow," that is incorporated by reference herein in its entirety. The related co-pending '120 patent application and the current application are assigned to the same entity.

FIELD OF THE DISCLOSURE

The present disclosure generally relates to the field of electronic fuses. In particular, the present disclosure is directed to a method of providing optimal field programming of electronic fuses.

BACKGROUND

Electronic fuses may commonly be found in many integrated circuit designs. One exemplary electronic fuse is a poly silicon fuse link that is coupled to a voltage line (usually referred to as FSource) at one end, and to an n-channel field-effect transistor (NFET), which is usually referred to as a programming FET, at its opposite end. During a fuse programming operation, a voltage is supplied by the FSource and the programming FET is turned on for a certain duration of time, which allows controlled electromigration to occur. The controlled electromigration causes a salicide/boron pile-up on an anode side of the poly fuse link. As a result, the resistance across the poly fuse link may rise from hundreds of ohms to many Kilo-ohms, in effect opening or "programming" the electronic fuse.

As is known in the art, the rise in fuse resistance during a fuse programming operation must meet a particular integrated circuit chip characteristic requirement. Using a "one size fits all" approach to a fuse programming operation may have two undesirable results: (1) a ruptured fuse or (2) a weakly programmed fuse. As such, if chip characteristics vary, the fuse programming process may need to be altered in order to provide the desired fuse yield. That is, the environmental variables of a fuse programming process, e.g., programming Vdd, FSource voltage, or the fuse programming duration, may need to be varied on a chip-by-chip basis according to a different characteristic requirement of each chip. Integrated circuit chip manufacturers have satisfactorily determined on a chip-by-chip basis whether and how one or more environmental variables need to be altered. As a result, the proper fuse programming conditions may be applied by automated test equipment during the normal manufacturing test flow and, thus, the electronic fuse programming operation is successfully performed.

While the conditions and parameters that are related to the electronic fuse programming process, which includes the environmental variables of a fuse programming process, are known to integrated circuit chip manufacturers, they are not known to customers that are receiving the chip, as it is not the manufacturer's practice to supply this information to customers. However, customers may wish to program electronic fuses in the field for a wide variety of reasons and, thus, customers may benefit from knowledge of the electronic fuse programming process. For example, upon receiving a chip of the customer's specifications from the manufacturer, a customer may wish to program electronic fuses in order to implement functional or performance settings therein. Unfortunately, without the proper electronic fuse programming information that takes into account the environmental variables of the customer's chip specifically, programming electronic fuses in the field (i.e., outside the manufacturing test environment) will likely result in low fuse yield.

Integrated circuit chip manufacturers have utilized an electronic chip identification (ECID) macro of a chip which may be used for storing non-test related data (e.g., chip identification data, such as lot number, wafer ID, chip coordinates). Chip customers may access this chip identification information. However, integrated circuit chip manufacturers have not provided customers in any fashion the knowledge to extend manufacturing processes (e.g., effectively program electronic fuses) to the field.

A need exists for a method of providing optimal field programming of electronic fuses, in order to enable chip customers to perform an electronic fuse programming process in the field that produces a desired fuse yield.

SUMMARY OF THE DISCLOSURE

In one embodiment, a method of programming an electronic fuse is provided. The method includes accessing a fuse programming condition identifier stored in one or more memory bits on a chip; correlating one or more optimal fuse programming conditions with the fuse programming condition identifier; and programming one or more fuses on the chip utilizing the one or more fuse programming conditions.

In another embodiment, an integrated circuit chip is provided. The chip includes one or more unprogrammed electronic fuses; and one or more memory bits including information related to optimal conditions for programming the one or more unprogrammed electronic fuses, the optimal conditions determined on a chip-by-chip basis.

In yet another embodiment, a method of programming an electronic fuse of a chip in the field by a customer of the manufacturer of the chip is provided. The method includes determining one or more optimal fuse programming conditions for one or more electronic fuses of a chip; storing an indicator of the one or more optimal fuse programming conditions in one or more memory bits on the chip; providing the chip to a customer in the field; and instructing the customer to access the one or more optimal fuse programming conditions from the one or more memory bits to enable the customer to program at least one of the one or more electronic fuses.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

In one embodiment, the present disclosure includes a method of providing optimal fuse programming conditions by which an integrated circuit (IC) chip customer may program electronic fuses in the field, i.e., outside of the manufacturing test environment. In particular, an optimal fuse programming identifier, which is correlated to a set of optimal fuse programming conditions, is provided to the customer in readable fashion on the customer's IC chip. After accessing the optimal fuse programming identifier on the customer's IC chip, the customer may apply a fuse programming process in the field according to the correlated optimal fuse programming conditions. In one example, this may allow the customer to achieve a desired electronic fuse yield.

Figure 1:
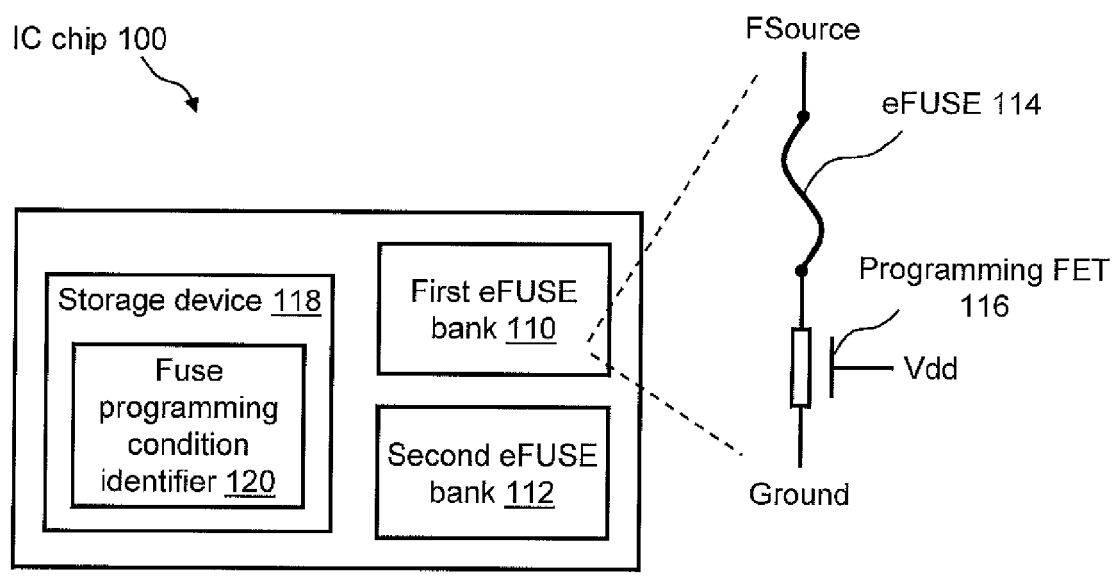
FIG. 1 illustrates a functional block diagram of one example of an integrated circuit chip, upon which is stored a fuse programming condition identifier for enabling a method of programming an electronic fuse in the field.

FIG. 1 illustrates a functional block diagram of an exemplary IC chip 100, upon which is stored a fuse programming condition identifier for enabling a method of programming an electronic fuse in the field. IC chip 100 may be any integrated circuit chip, such as an application specific integrated circuit (ASIC) device, that includes at least one arrangement of electronic fuses (eFUSEs). For example, FIG. 1 shows that IC chip 100 includes a first eFUSE bank 110 and a second eFUSE bank 112, which may each be a single eFUSE or a string of eFUSEs (e.g., forming a certain logic macro within IC chip 100). The eFUSEs of banks 110 and/or 112 may be initially in an unprogrammed (i.e., closed) state. In one example, first eFUSE bank 110 and/or eFUSE bank 112 may be eFUSEs that form certain redundancy structures, such as structures commonly found in memory arrays (i.e., redundant wordlines or redundant columns). In this example, the eFUSEs may be programmed to disconnect a normal wordline and replace it with a redundant wordline when, for example, the normal wordline is detected as defective. In another example, first eFUSE bank 110 and/or second eFUSE bank 112 may be eFUSEs that form an ECID macro, which contains eFUSEs that are programmed to a value that reflects, for example, chip identification data.

Additionally, FIG. 1 shows a detail of an exemplary eFUSE 114 of first eFUSE bank 110. More specifically, eFUSE 114 may be a poly silicon fuse link that is coupled to a voltage line (FSource) at one end, and to an NFET, which is referred to as a programming FET 116, at its opposite end. The gate of programming FET 116 is controlled by the chip voltage (Vdd) of IC chip 100. During an eFUSE programming operation, a voltage is supplied by the FSource and programming FET 116 is turned on for a certain duration of time by applying Vdd, which allows controlled electromigration to occur. The controlled electromigration may cause a salicide/boron pile-up on an anode side of the eFUSE 114. As a result, the resistance across eFUSE 114 may rise (e.g., from hundreds of ohms to many Kilo-ohms), in effect opening (i.e., programming) eFUSE 114.

Referring again to FIG. 1, IC chip 100 further includes a storage device 118, within which is stored a digital value that is related to one or more fuse programming condition identifiers 120. Storage device 118 may be any mechanism by which one or more bits of digital data may be stored, such as, but not limited to, a memory device or one or more eFUSEs. In one example, storage device 118 may be a non-volatile static random access memory (SRAM) device or a non-volatile programmable read-only memory (PROM) device. In another example, storage device 118 may be one or more surplus eFUSEs within a bank of existing eFUSEs within IC chip 100, such as, but not limited to, surplus eFUSEs 114 within first eFUSE bank 110 or second eFUSE bank 112. In yet another example, storage device 118 may be, or may be part of, one or more eFUSEs of an ECID. One or more fuse programming condition identifiers may be represented by one or more logical values stored in a storage device, such as storage device 118. For example, a programmed or unprogrammed state of an eFUSE 114 may represent a logic one (1) or zero (0), e.g., unprogrammed eFUSE=1, programmed eFUSE=0, or visa versa.

Those skilled in the art will recognize that an integrated circuit device, which is represented by IC chip 100, may include arrangements of one or more logic functions, which for simplicity are not shown in FIG. 1.

The conditions of an eFUSE programming process may be controlled precisely on a chip-by-chip basis during the manufacturing test operation in order to achieve a high eFUSE yield, by avoiding ruptured eFUSEs or weakly programmed eFUSEs. The optimal eFUSE programming conditions are variable on a chip-by-chip basis due to manufacturing process variations, e.g., from one IC chip 100 to a next IC chip 100, to a next IC chip 100, and so on. One exemplary method of determining the optimal eFUSE programming conditions is described with reference to the related copending U.S. patent application Ser. No. 11/276,120, filed Feb. 15, 2006, and titled "Electronic fuse blow mimic and methods for adjusting electronic fuse blow," which is incorporated herein by reference in its entirety. The '120 patent application describes a system, method, and program product for adjusting an environmental variable of a fuse programming of an electronic fuse. In particular, a mimic NFET may be coupled to a fuse programming source voltage line, a fuse programming gate voltage line, and a chip ground in the same manner as the electronic fuse, except that the mimic NFET is not attached to an electronic fuse. The on-current (I-ON) and off-current (I-OFF) of the mimic NFET are measured to determine a fuse programming current (I-PROGRAM) of the electronic fuse. The environmental variable is adjusted based on the determined programming current. Another example of a method is summarized with reference to a method 300 of FIG. 3 below.

Example environmental variables include, but are not limited to, FSource, Vdd, background leakage current, I-PROGRAM, chip vs. tester ground offset, programming duration, temperature, and accuracy of test equipment. Fuse programming condition identifier 120 may be a digital code of one or more bits that may be correlated to a certain eFUSE programming condition, which may be a unique optimal eFUSE programming condition for a given IC chip 100. For example, fuse programming condition identifier 120 may be uniquely encoded with a first value on a first IC chip 100 for correlating to a first optimal eFUSE programming condition therefor, uniquely encoded with a next unique value on a next IC chip 100 for correlating to a next optimal eFUSE programming condition therefor, and uniquely encoded with a next unique value on a next IC chip 100 for correlating to a next optimal eFUSE programming condition therefor. The code contained in fuse programming condition identifier 120 may correlate to one or any combination of multiple environmental variables, which include, for example, FSource, Vdd, background leakage current, I-PROGRAM, chip vs. tester ground offset, programming duration, temperature, and accuracy of test equipment.

The number of bits that form fuse programming condition identifier 120 is dependent on the number of or combinations of environmental variables needed to convey the optimal eFUSE programming conditions for a given IC chip. In one example, fuse programming condition identifier 120 may be a 1-bit code that correlates to a first and second optimal Vdd value, e.g., fuse programming condition identifier 120=0 for Vdd=1.20 volts and fuse programming condition identifier 120=1 for Vdd=1.35 volts. In another example, fuse programming condition identifier 120 may be a 2-bit code that correlates to up to four optimal Vdd values, e.g., fuse programming condition identifier 120=00 for Vdd=1.20 volts, fuse programming condition identifier 120=01 for Vdd=1.35 volts, and fuse programming condition identifier 120=10 for Vdd=1.50 volts. In yet another example, fuse programming condition identifier 120 may be an n-bit binary code that correlates to the actual digital value (having a certain resolution) of a certain eFUSE programming condition, e.g., an 8-bit, 10-bit, 12-bit, or 16-bit binary word that represents the actual value of, for example, FSource, Vdd, or I-PROGRAM. In all cases, the information of fuse programming condition identifier 120 may be stored by the chip manufacturer during the normal manufacturing test flow. In the case wherein the bits forming fuse programming condition identifier 120 are memory bits, these bits are set to a desired state via known memory write operations. Alternatively, in the case wherein the bits forming fuse programming condition identifier 120 are eFUSEs 114, one or more eFUSEs 114 are set to either a programmed or unprogrammed state according to a desired code.

As exemplified by IC chip 100 of FIG. 1, the chip manufacturer may provide a fuse programming condition identifier, such as fuse programming condition identifier 120, within a chip and, thereby, provides a readable mechanism that is accessible by a customer and by which a customer may then correlate an optimal eFUSE programming condition for his/her chip. Correlation may occur in a variety of ways. In one example, a correlation may include comparison of a fuse programming condition identifier with a digitally stored value (e.g., in a lookup data table). In another example, a correlation may include comparison of a fuse programming condition identifier with a printed manual. In yet another example, a correlation may include reading the fuse programming condition identifier to reveal an actual programming condition. As a result, the fuse programming condition identifier may enable a customer to apply an optimal eFUSE programming condition, which is unique to a particular chip, in order to efficiently program eFUSEs in the field, i.e., outside of the manufacturing test environment, such as during the customer's card level test operation. More details are provided with reference to FIGS. 2, 3, and 4.

Figure 2:
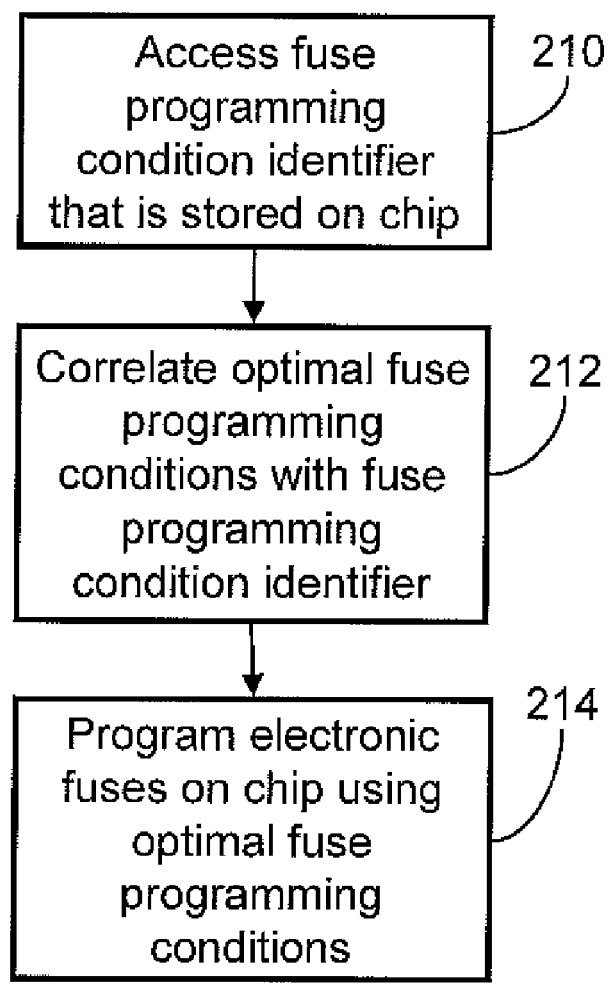
FIG. 2 illustrates a flow diagram of one example of a method of programming an electronic fuse by use of the fuse programming condition identifier that is stored on the integrated circuit chip.

FIG. 2 illustrates a flow diagram of one embodiment of a method 200 of programming an electronic fuse by use of a fuse programming condition identifier, such as fuse programming condition identifier 120, which is stored on an integrated circuit chip, such as IC chip 100. Method 200 includes, but is not limited to, the following steps.

At step 210, a fuse programming condition identifier that is stored in one or more memory bits on a chip are accessed. In one example and referring again to FIG. 1, after delivering a chip, such as IC chip 100, from the chip manufacturer to the chip purchaser, fuse programming condition identifier 120 of storage device 118 is accessed by the chip purchaser. In the case wherein the bits forming fuse programming condition identifier 120 are memory bits, these bits are accessed via known memory read operations. Alternatively, in the case wherein the bits forming fuse programming condition identifier 120 are eFUSEs 114, the programmed or unprogrammed state of the one or more eFUSEs 114 is detected via standard circuitry that is associated with, for example, first eFUSE bank 110 or second eFUSE bank 112.

At step 212, one or more optimal eFUSE programming conditions are correlated with the information of fuse programming condition identifier, such as correlated with the information of fuse programming condition identifier 120 of storage device 118 of IC chip 100. In one example, this correlation may be performed by the chip manufacturer providing the chip purchaser any standard method of correlating each possible value that may be encoded in fuse programming condition identifier 120 with an optimal eFUSE programming condition e.g., a software lookup table, an electronic or printed guidebook, or a telephone customer service center. In one example, a 1-bit fuse programming condition identifier 120 that is set to "0" may correlate to, for example, set Vdd=1.20 volts and that is set to "1" may correlate to, for example, set Vdd=1.35 volts. In another example, a 2-bit fuse programming condition identifier 120 that is set to "00" may correlate to, for example, set Vdd=1.20 volts; that is set to "01" may correlate to, for example, set Vdd=1.35 volts; and that is set to "10" may correlate to, for example, set Vdd=1.50 volts.

At step 214, one or more fuses on the IC chip are programmed utilizing the one or more correlated eFUSE programming conditions. In particular, the IC chip purchaser applies the correlated optimal eFUSE programming conditions that were extracted from his/her IC chip during, for example, manufacturing wafer and/or module test operations, in order to program one or more IC chip purchaser-selected eFUSEs 114.

Figure 3:
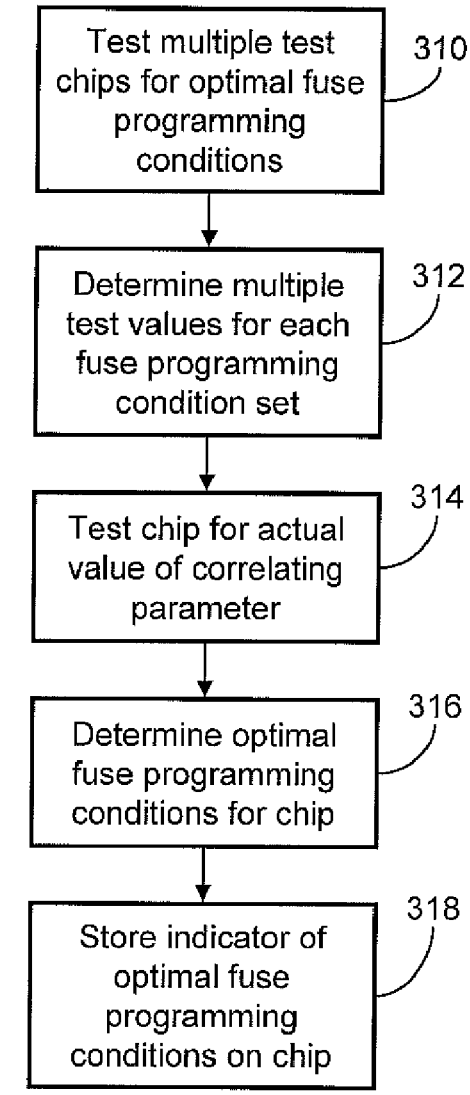
FIG. 3 illustrates a flow diagram of one example of a method of determining one or more optimal fuse programming condition identifiers for enabling a method of programming an electronic fuse in the field.

FIG. 3 illustrates a flow diagram of one embodiment of a method 300 of determining one or more optimal fuse programming condition identifiers for enabling a method of programming an electronic fuse, such as programming an electronic fuse by use of method 300. In one example, one or more optimal fuse programming condition identifiers may be determined by use of method 300 on a chip-by-chip basis during a manufacturing test operation. Method 300 includes, but is not limited to, the following steps.

At step 310, a plurality of IC test chips are tested for the optimal chip programming conditions. In particular, a chip manufacturer executes an eFUSE programming process on a plurality (e.g., hundreds to millions) of IC test chips, in order to understand the preferred way to program the eFUSEs for a selection of environmental variations.

At step 312, a plurality of test values of a correlating parameter are determined from the plurality of IC test chips. A correlating parameter may be any measurable value that may indicate a corresponding value for a fuse programming environmental condition. For example, a fuse programming current may be measured at a particular fuse programming condition value, e.g., a particular Vdd value. Each of the plurality of test values may be for one of a plurality of fuse programming condition sets. The test values are based upon the eFUSE-programming information that is gathered in step 310 for every known process variation. For example, physical measurements of an IC test chip may be mapped to certain eFUSE-programming parameters.

At step 314, each IC test chip is tested for an actual value of the correlating parameter. In one example and referring to paragraphs 0018 through 0020 of the co-pending '120 patent application, the background leakage current (I-BKG) of the IC chip under test is measured, the on-current (I-ON) of a mimic programming FET at nominal Vdd and FSource values is measured, I-BKG is subtracted from I-ON in order to determine the fuse programming current (I-PROGRAM).

At step 316, an optimal one of the plurality of fuse programming condition sets is determined for the IC chip under test by comparing an actual value to a plurality of test values.

In one example and referring to paragraph 0021 of the co-pending '120 patent application, a three-way decision may be performed. Specifically, an upper level threshold, for example, 14 mA, and a lower level threshold, for example, 10 mA, are set for the determined I-PROGRAM. If the determined I-PROGRAM is higher than the upper level threshold, here 14 mA, the programming Vdd may be decreased, for example, from the preset 1.35V to 1.20V. If the determined I-PROGRAM is lower than the lower level threshold, here 10 mA, the programming Vdd may be increased, for example, from the preset 1.35V to 1.50V. Also, if the determined I-PROGRAM is within the range between the upper level threshold, here 14 mA, and the lower level threshold, here 10 mA, the programming Vdd may be considered proper and be maintained the same as the preset value, here 1.35V. In doing so, an optimal value of the programming Vdd is determined that correlates to the actual I-PROGRAM of the IC Chip Under Test.

At step 318, an indicator of the optimal one of the plurality of fuse programming condition sets is stored as the fuse programming condition identifier. For example, if the optimal programming Vdd is 1.20V, a 2-bit fuse programming condition identifier 120 for the IC chip under test may be set to "00;" if the optimal programming Vdd is 1.35V, the 2-bit fuse programming condition identifier 120 may be set to "01;" and if the optimal programming Vdd is 1.50V, the 2-bit fuse programming condition identifier 120 may be set to "10."

Figure 4:
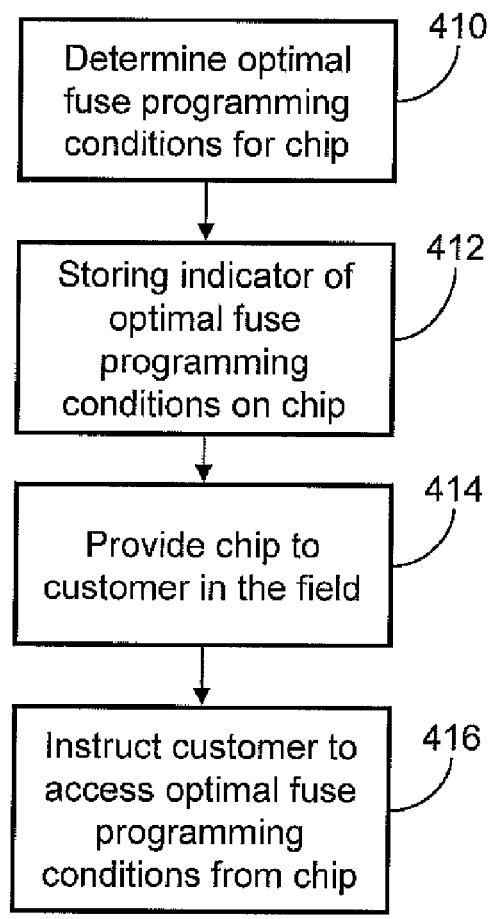
FIG. 4 illustrates a flow diagram of one example of a method of programming an electronic fuse in the field by an integrated circuit chip customer.

FIG. 4 illustrates a flow diagram of a method 400 of programming an electronic fuse in the field by, for example, an integrated circuit chip customer. Method 400 includes, but is not limited to, the following steps.

At step 410, one or more optimal fuse programming conditions are determined. These conditions will apply to all eFUSEs on a given chip such as IC chip 100 by, for example, performing steps 310 through 316 of method 300 of FIG. 3.

At step 412, during the manufacturing test operation, an indicator of the one or more optimal fuse programming conditions is stored in one or more memory bits on the IC chip under test. For example, an indicator of the one or more optimal fuse programming conditions is stored in fuse programming condition identifier 120 of storage device 118 of IC chip 100, as described, for example, in FIG. 1 and in step 318 of method 300 of FIG. 3.

At step 414, the chip manufacturer provides an IC chip, such as IC chip 100, to a customer in the field.

At step 416, the IC chip customer is instructed on how to access the one or more optimal fuse programming conditions from the one or more memory bits in order to enable the customer to program at least one of the one or more eFUSEs. For example, the IC chip manufacturer may provide instructions to the IC chip customer on how to access, for example, fuse programming condition identifier 120 of storage device 118 of IC chip 100. Additionally, the IC chip manufacturer may provide the chip purchaser a standard method of correlating each possible value that may be encoded in fuse programming condition identifier 120 with a respective optimal eFUSE programming condition. Standard correlation methods include, but are not limited to, a software lookup table, an electronic or printed guidebook, or calling by telephone a customer service center.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of programming an electronic fuse of a chip in the field by a customer of the manufacturer of the chip, the method comprising:
   determining one or more optimal fuse programming conditions for one or more electronic fuses of a chip;
   storing an indicator of said one or more optimal fuse programming conditions in one or more memory bits on said chip;
   providing said chip to a customer in the field; and
   instructing said customer to access said one or more optimal fuse programming conditions from said one or more memory bits to enable said customer to program at least one of said one or more electronic fuses.

2. A method according to claim 1, wherein said one or more memory bits are included in an electronic chip identification macro.

3. A method according to claim 1, wherein said one or more memory bits includes an electronic fuse.

4. A method according to claim 1, wherein said determining of said one or more optimal fuse programming conditions is conducted on a chip-by-chip basis during manufacture testing of said chip.

5. A method according to claim 1, wherein said determining of said one or more optimal fuse programming conditions includes:
   testing a plurality of test chips for optimal chip programming conditions;
   determining a plurality of test values of a correlating parameter from said plurality of test chips, each of said plurality of test values being for one of a plurality of fuse programming condition sets;
   testing said chip for an actual value of said correlating parameter;
   determining an optimal one of said plurality of fuse programming condition sets for said chip by comparing said actual value to said plurality of test values;
   storing an indicator of said optimal one of said plurality of fuse programming condition sets as said fuse programming condition identifier.

6. A method according to claim 5, wherein said correlating parameter is a fuse programming current for said chip.

7. A method according to claim 6, wherein said fuse programming current is determined by
   measuring a background current on a fuse programming source line of an electronic fuse of said chip;
   measuring an 'on' current on said fuse programming source line at a predetermined value of a chip programming parameter without exposing said electronic fuse to said 'on' current; and
   determining a difference between said 'on' current and said background current.

8. A method according to claim 1, wherein said one or more optimal fuse programming conditions includes a condition selected from the group consisting of a fuse programming source voltage, a fuse programming gate voltage, a fuse programming time, and any combinations thereof.

* * * * *